(12) United States Patent
Leibfried et al.

(10) Patent No.: US 9,071,059 B2
(45) Date of Patent: Jun. 30, 2015

(54) PROTECTIVE DEVICE AGAINST CORROSION FOR AN ONBOARD ELECTRICAL SYSTEM AND METHOD FOR THE CONTROL THEREOF

(75) Inventors: Oliver Leibfried, Siegelsbach (DE); Roland Gerstner, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 760 days.

(21) Appl. No.: 12/736,883

(22) PCT Filed: Apr. 20, 2009

(86) PCT No.: PCT/EP2009/054664
§ 371 (c)(1),
(2), (4) Date: Apr. 7, 2011

(87) PCT Pub. No.: WO2009/146973
PCT Pub. Date: Dec. 10, 2009

(65) Prior Publication Data
US 2011/0178672 A1     Jul. 21, 2011

(30) Foreign Application Priority Data
Jun. 2, 2008   (DE) .................. 10 2008 002 154

(51) Int. Cl.
| | |
|---|---|
| G01M 17/00 | (2006.01) |
| H02J 7/00 | (2006.01) |
| G01R 31/28 | (2006.01) |
| B60R 16/023 | (2006.01) |

(52) U.S. Cl.
CPC ............ *H02J 7/0031* (2013.01); *B60R 16/0232* (2013.01); *G01R 31/2829* (2013.01)

(58) Field of Classification Search
USPC .................................................. 701/29.1–29.2
See application file for complete search history.

(56) References Cited

U.S. PATENT DOCUMENTS

| | | | | |
|---|---|---|---|---|
| 5,534,364 | A | * | 7/1996 | Watanabe et al. ................ 429/61 |
| 5,968,102 | A | * | 10/1999 | Ichimaru et al. ................. 701/37 |
| 6,070,692 | A | * | 6/2000 | Nishino et al. ................. 180/443 |
| 6,646,845 | B1 | | 11/2003 | Turner et al. |
| 2006/0036381 | A1 | * | 2/2006 | Klein et al. ...................... 702/64 |
| 2007/0132463 | A1 | * | 6/2007 | Anderson ..................... 324/713 |
| 2008/0048877 | A1 | | 2/2008 | Takahashi |
| 2008/0151454 | A1 | * | 6/2008 | Uhl ................................ 361/87 |
| 2009/0189570 | A1 | * | 7/2009 | Abe .............................. 320/162 |

FOREIGN PATENT DOCUMENTS

| | | |
|---|---|---|
| DE | 10 2006 038263 | 5/2007 |
| WO | 02/080327 | 10/2002 |
| WO | 2005/115805 | 12/2005 |

* cited by examiner

*Primary Examiner* — Hussein A. Elchanti
(74) *Attorney, Agent, or Firm* — Kenyon & Kenyon LLP

(57) ABSTRACT

A protective device against corrosion for an onboard electrical system, in particular thermal corrosion. The protective device includes at least one sensor for detecting a shunt and a switching device which is controllable by the sensor and outputs a switching pulse for the activation of a control unit upon control by the sensor. Also described is a method for the control of the onboard electrical system.

10 Claims, 2 Drawing Sheets

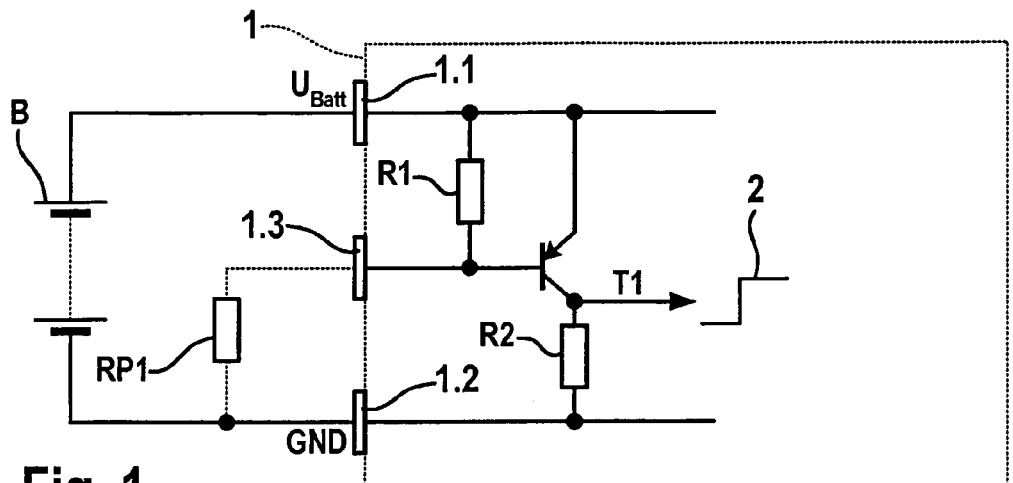
Fig. 1
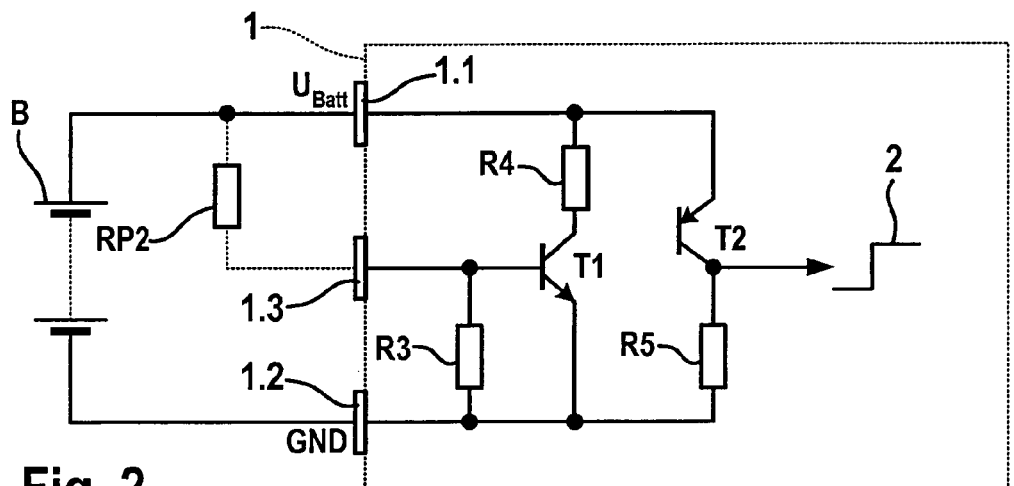
Fig. 2
Fig. 3
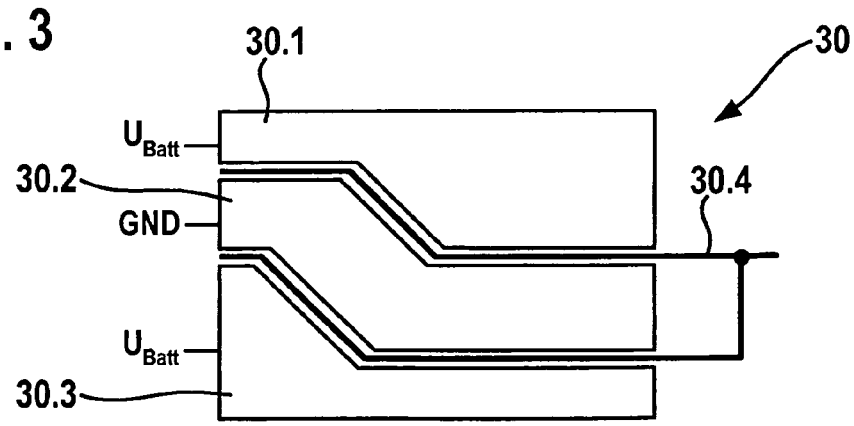

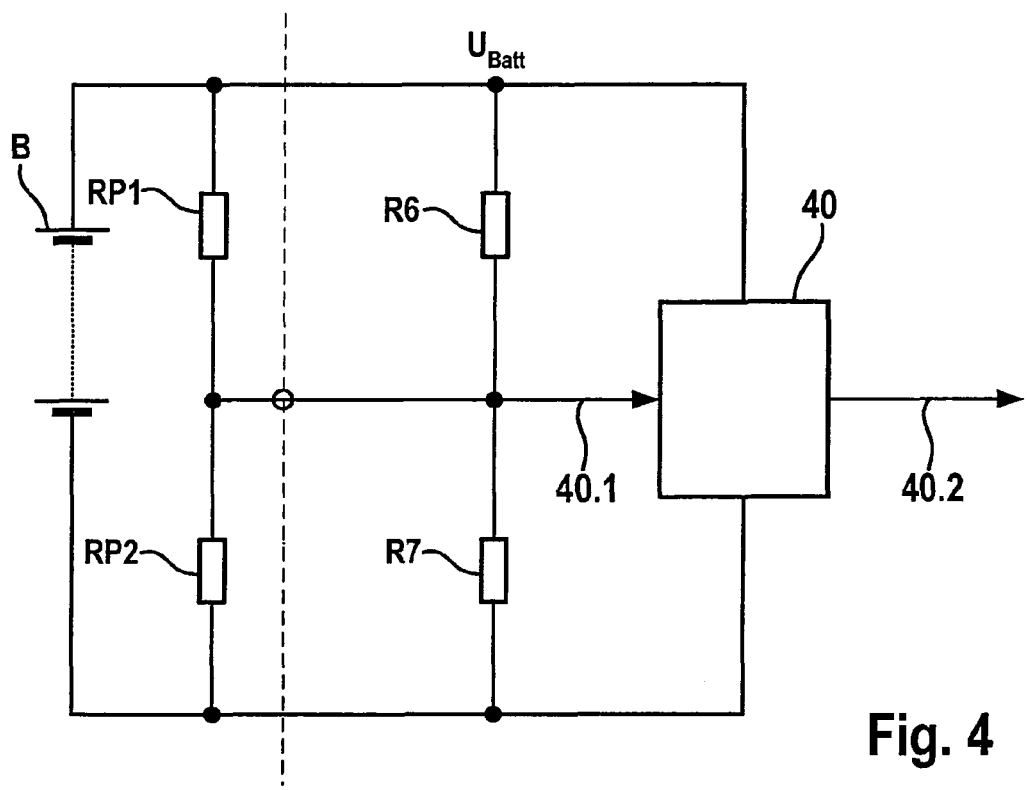
Fig. 4
Fig. 5
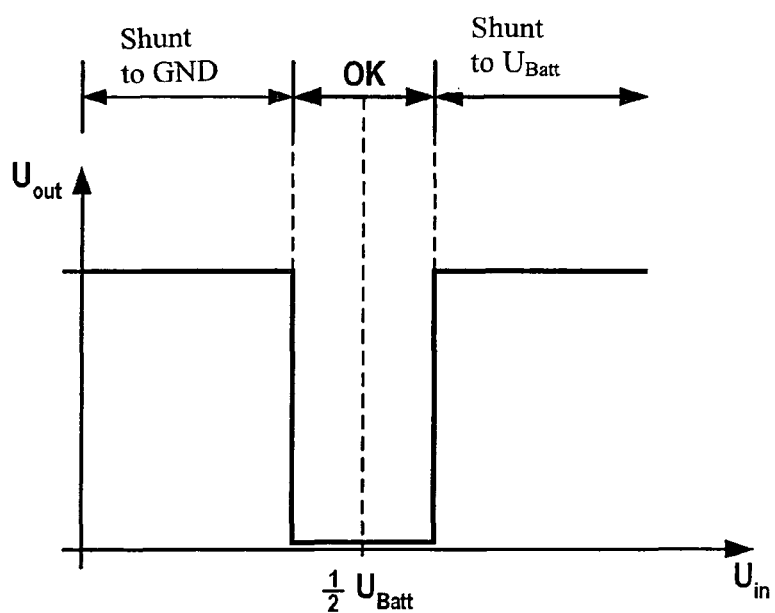

PROTECTIVE DEVICE AGAINST CORROSION FOR AN ONBOARD ELECTRICAL SYSTEM AND METHOD FOR THE CONTROL THEREOF

FIELD OF THE INVENTION

The present invention relates to a protective device against corrosion for an onboard electrical system. Furthermore, the present invention relates to a method for the control of an onboard electrical system.

BACKGROUND INFORMATION

The onboard electrical system of a modern vehicle having a plurality of electrical consumers is extraordinarily complex. Great care is already required during the design of such an onboard electrical system in order to guarantee high operational reliability over the lifetime of the vehicle. In spite of the care taken during the design of the onboard electrical system, faults may not be prevented from occurring in the onboard electrical system during the lifetime of the vehicle. Fault sources are, for example, impermissible strain on components of the onboard electrical system and/or inadequate maintenance of the vehicle. A typical fault is a shunt, which results in uncontrolled current flow. In the event of adverse circumstances, this may result in a smoldering fire and even destruction of the vehicle.

The onboard electrical system of a modern vehicle includes at least one control unit, which may also recognize such faults in a vehicle which is put into operation. However, a problem may occur during a long operating pause of the vehicle if the control unit which performs the fault test is turned off. In spite of shutdown of the vehicle, at least parts of the onboard electrical system are still connected to the battery. A shunt of the parts of the onboard electrical system which are still under voltage and thermal corrosion caused by the shunt are no longer able to be readily recognized, however.

SUMMARY OF THE INVENTION

The protective device includes a sensor for detecting a shunt and a switch device, which is controllable by the sensor. As soon as the sensor detects a shunt, the switch device is controlled to provide a control pulse at the output to activate at least one control unit, which is in the idle state. The activated control unit checks the onboard electrical system for faults. In case of a fault, protective measures are initiated in order to bring the vehicle into the safest possible state. A corresponding fault code is advantageously stored in a storage device of a control unit to document the fault and make it easier for the garage to find the fault. In the case of a vehicle in operation, a warning signal is advantageously output to make the driver aware of the fault. If the warning signal is ignored, functions of the vehicle may advantageously be shut down or changed in order to prompt the driver to seek repairs. In the case of a parked vehicle, after recognizing a fault, the protective device first activates a control unit, which is in the idle state, and which then performs a thorough check of the onboard electrical system.

In the case of verification of the fault, further control units are activated, which switch high power consumers to discharge the battery as rapidly as possible. A discharged battery is no longer able to provide power which is necessary for thermal corrosion. The vehicle does become temporarily incapable of starting as a result of the exemplary embodiments and/or exemplary methods of the present invention. However, it is advantageously put into a state which is safe with respect to corrosion. In this way, significant resulting damage may advantageously be prevented. Further advantages of the exemplary embodiments and/or exemplary methods of the present invention result from the following description, the claims, and the drawings.

The exemplary embodiments and/or exemplary methods of the present invention are explained in greater detail hereafter for exemplary purposes on the basis of the drawings.

BRIEF DESCRIPTION OF THE DRAWINGS

FIG. 1 shows a first exemplary embodiment of the present invention.

FIG. 2 shows a second exemplary embodiment of the present invention.

FIG. 3 shows a third exemplary embodiment of the present invention having a sense line.

FIG. 4 shows a fourth exemplary embodiment of the present invention.

FIG. 5 shows a diagram having illustration of the input and output voltage.

DETAILED DESCRIPTION

Thermal corrosion is primarily caused by a shunt, which is not recognized in a timely manner, at plug pins or lines which are continuously at battery voltage. This is a comparatively slow process, which may last multiple days from its beginning until reaching a critical state. If the process is not recognized in a timely manner, this may result at least in destruction of individual components of the onboard electrical system, so that the vehicle is no longer able to be operated without repair. In particularly critical cases, a smoldering fire may certainly also be triggered, which not only endangers the onboard electrical system of the vehicle. Using the exemplary embodiments and/or exemplary methods of the present invention, effective protection against the harmful consequences of a shunt and subsequent thermal corrosion may advantageously be achieved.

FIG. 1 shows a first exemplary embodiment of the present invention on the basis of a circuit diagram of a subarea of an onboard electrical system. A control unit is identified by reference numeral 1, which also performs monitoring functions during vehicle operation, but is shut down when the vehicle is stationary in order to preserve battery B. However, control unit 1 is continuously connected to battery B via terminals 1.1 and 1.2 even in the shut-down state. A shunt occurring in control unit 1 may therefore result in thermal corrosion. Such a shunt to ground is indicated in FIG. 1 by resistor RP1.

The exemplary embodiments and/or exemplary methods of the present invention provides a monitoring device, which detects such a shunt in a timely manner, so that countermeasures may be initiated, before significant damage occurs to the onboard electrical system and/or the vehicle. The monitoring device includes a sensor 1.3, which controls a switch device, which includes a resistor R1, a resistor R2, and a transistor T1. As soon as sensor 1.3, which is situated in an area of the onboard electrical system that is at risk, detects a voltage drop caused by a fault current, the switch device is controlled and produces a switch pulse 2, which activates control unit 1, at its output terminal.

The exemplary embodiment shown in FIG. 2 proceeds from a shunt to the positive pole of battery B, which is applied to terminal 1.1 of control unit 1. The current flowing through the shunt produces a voltage drop, which is detected by sensor 1.3 and controls a switch device, which includes resistor R3, a resistor R4, a resistor R5, and two transistors T1 and T2. As soon as sensor 1.3, which is situated in an area of the onboard electrical system that is at risk, detects a voltage drop caused by a fault current, the switch device is controlled and produces a switch pulse 2, which activates control unit 1, at its output terminal.

A fourth embodiment variant, which is shown in FIG. 4, includes a combination of the specific embodiments according to FIG. 1 and FIG. 2. In this way, shunts to ground and/or to the positive pole of the battery may be detected by the same circuit configuration. This embodiment variant is implemented, for example, by a voltage divider, which includes RP1 and RP2 and lies between the positive pole and ground and whose central tap is connected to input 40.1 of a window comparator 40. Voltage $U_{out}$, which is available at output 40.2 of window comparator 40 as a function of input voltage $U_{in}$ applied to input 40.1, is shown in the diagram illustrated in FIG. 5. In the event of the absence of a shunt, voltage ½ $U_{batt}$, i.e., half of the battery voltage, is applied to input 40.1 and output 40.2 of window comparator 40. In the event of a shunt to ground (GND) or in the event of a shunt to the positive pole ($U_{batt}$) of battery B, in contrast, a substantially higher voltage is measurable at output 40.2 of window comparator 40.

Measures that are used if an interfering shunt is recognized are described hereafter. Since an interfering shunt may also occur during driving operation, for example, a warning device, which notifies the driver of this disturbance, is controlled by a switching signal of the switching device, which is activated by a signal of sensor 1.3. The warning device may be a warning device which outputs a visual, acoustic, or haptic warning signal or any desired combination of these signals. If the driver ignores the warning signal, an important function of control unit 1 may be intentionally turned off as a further escalation step in order to prompt the driver to seek repairs and to replace control unit 1 as a precaution. Significant damage as a result of thermal corrosion may be prevented in this way.

However, thermal corrosion that occurs unnoticed during a longer shutdown phase of the vehicle is particularly critical. A longer shutdown of the vehicle occurs, for example, if the vehicle is parked in a parking garage or a parking lot for a long time as a result of airline travel by the driver. As soon as the protective device of the onboard electrical system has detected a critical shunt, the switching device is controlled. A control unit of the vehicle, such as control unit 1, is put into operation by control pulse 2, which is produced at the output of the switching device. Activated control unit 1 checks the onboard electrical system and its components repeatedly if necessary. If this check shows that it is a false alarm, i.e., there is no critical shunt, control unit 1 is turned off again or put into the idle state optionally after a specifiable time delay. However, if a critical shunt is detected by the test run or test runs of control unit 1, control unit 1 remains turned on.

In order to permanently document the occurrence of the fault, a corresponding entry is first made in a fault memory of the control unit. This makes it easier for the garage to narrow down the fault when the fault memory is read out later. Further control units which control consumers of the onboard electrical system having high power consumption in particular are activated in a next step. This activation may be performed via the bus system in a vehicle equipped with a bus system. Alternatively, the additional control units may also be activated via special wake-up lines. The activated control units switch to an operating mode which results in particularly high power consumption. For example, the ignition, the rear window heater, the seat heater, the external lighting of the vehicle, or any desired combination of these consumers may be turned on. The high current flow through these consumers results in rapid draining of the battery of the vehicle. The battery is no longer available as a power source after being drained, so that the thermal corrosion may be put to a stop. The vehicle, which is made incapable of starting in this way, represents a substantially smaller danger than a vehicle having progressing thermal corrosion.

During a later start attempt of the parked vehicle, the completely drained battery will first be noticed. During a following start of the vehicle after the drained battery is charged or replaced with a charged battery or a jump-start by another vehicle, the fault is displayed to warn the driver, since the cause of the fault is stored in the fault memory of control unit 1. If the driver ignores this fault notification after restarting the vehicle, as already noted, the driver may be persistently prompted to go to a garage by turning off or restricting important operating functions of the vehicle. For example, an artificial speed limit may be induced by the engine control unit. The fault location may be localized comparatively easily in the garage on the basis of the entry in the fault memory. The component or control unit causing the shunt may be replaced. In order for the functional restriction to be maintained even after an external start, the fault message is expediently stored in a nonvolatile memory, such as an EEPROM.

Instead of a dot-shaped sensor or contact pin, a sense line which detects a possibly occurring shunt may also be provided according to a third exemplary embodiment of the present invention. This exemplary embodiment is explained by FIG. 3, which shows a top view of a simplified circuit board 30. Multiple printed conductors 30.1, 30.2, 30.3, which conduct continuous voltage, are applied to one surface of circuit board 30. Printed conductors 30.1 and 30.3 are connected to the positive pole of a battery, for example. Printed conductor 30.2 is connected to the ground terminal of the battery. A branched sense line 30.4 is situated between printed conductors 30.1 and 30.2 or 30.2 and 30.3. This sense line 30.4 may sense shunts occurring between printed conductors 30.1, 30.2, 30.3 and control one of the switching devices shown in FIG. 1 or FIG. 2, for example.

Sensor 1.3 may additionally be designed in such a way that it detects a temperature increase caused by thermal corrosion. Alternatively, an additional temperature sensor may be provided for this purpose.

What is claimed is:

1. A protective device to protect against corrosion of an onboard electrical system, comprising:
    at least one sensor for detecting a shunt; and
    a switching device, adapted to be controlled by the sensor and to output a switching pulse to activate a control unit in the event of a detection of a shunt;
    wherein after detection of the shunt in a parked vehicle, the control unit, which monitors the onboard electrical system, is activated, and wherein the activated control unit checks the onboard electrical system for proper functioning.

2. The protective device of claim 1, wherein the at least one sensor is configured to detect a voltage drop which arises as a result of a fault current induced by the shunt.

3. The protective device of claim 1, wherein, in the event of detection of the shunt, a corresponding fault code is stored in a storage device of a control unit.

4. The protective device of claim 3, wherein a warning signal is output in the event of detection of the shunt.

5. The protective device of claim 3, wherein, in the event of a false alarm, the initially activated control unit is returned to an idle state.

6. The protective device of claim 3, wherein, in the event of verification of an existing fault, the control unit, which was initially activated for the performance of a test routine, is kept in its active state, and wherein the activated control unit alerts further control units, which control high power consumers of the onboard electrical system.

7. The protective device of claim 3, wherein high current consumers remain turned on until the battery of the vehicle is essentially discharged.

8. The protective device of claim 1, further comprising:
    a temperature sensor, which reacts to an elevated temperature induced by the shunt.

9. The protective device of claim 1, wherein corrosion is thermal corrosion.

10. The protective device of claim 3, wherein, after detection of the shunt in a parked vehicle, a control unit, which monitors the onboard electrical system, is activated, and wherein the activated control unit repeatedly checks the onboard electrical system for proper functioning.

\* \* \* \* \*